United States Patent [19]

Bryant et al.

[11] Patent Number: 4,458,296
[45] Date of Patent: Jul. 3, 1984

[54] AVIONIC SHELF ASSEMBLY

[75] Inventors: Richard M. Bryant, Woodinville; Henry P. Clemen, Jr.; Bellevue; William H. Weaver, Kent, all of Wash.

[73] Assignee: The Boeing Company, Seattle, Wash.

[21] Appl. No.: 379,583

[22] Filed: May 19, 1982

[51] Int. Cl.³ .......................... H02B 1/04; H05K 7/20
[52] U.S. Cl. ................................... 361/383; 361/426; 98/40 D
[58] Field of Search .................. 62/418; 361/381–384, 361/395, 399, 426, 429; 174/16 R; 277/178; 98/40 D

[56] References Cited

U.S. PATENT DOCUMENTS

| | | | |
|---|---|---|---|
| 3,315,585 | 4/1967 | Hawkins | 98/40 D |
| 3,411,426 | 11/1968 | Carlson | 98/40 D |
| 3,771,023 | 11/1973 | Hollingsead | 361/383 |
| 3,871,937 | 3/1975 | Hollingsead | 277/178 |
| 4,044,515 | 8/1977 | Hollingsead | 361/383 |

Primary Examiner—G. P. Tolin
Attorney, Agent, or Firm—Conrad O. Gardner; Bernard A. Donahue

[57] ABSTRACT

A mounting frame for avionic trays which accommodates various tray sizes and provides a structrual member which also serves as a wire bundle and terminal block support and provides for an integral plenum that receives hot air and distributes cooling air. A seal and orifice assembly feature in the shelf assembly includes seal cross section geometry suitable for accommodating an adjustable lip feature which adapts to the variable tolerance encountered in the avionic box tray assembly interface. The metal ground terminal block utilizes poke-home electrical pins and sockets which are mounted to structure with rivets, thereby establishing ground contact with the aircraft structure.

2 Claims, 9 Drawing Figures

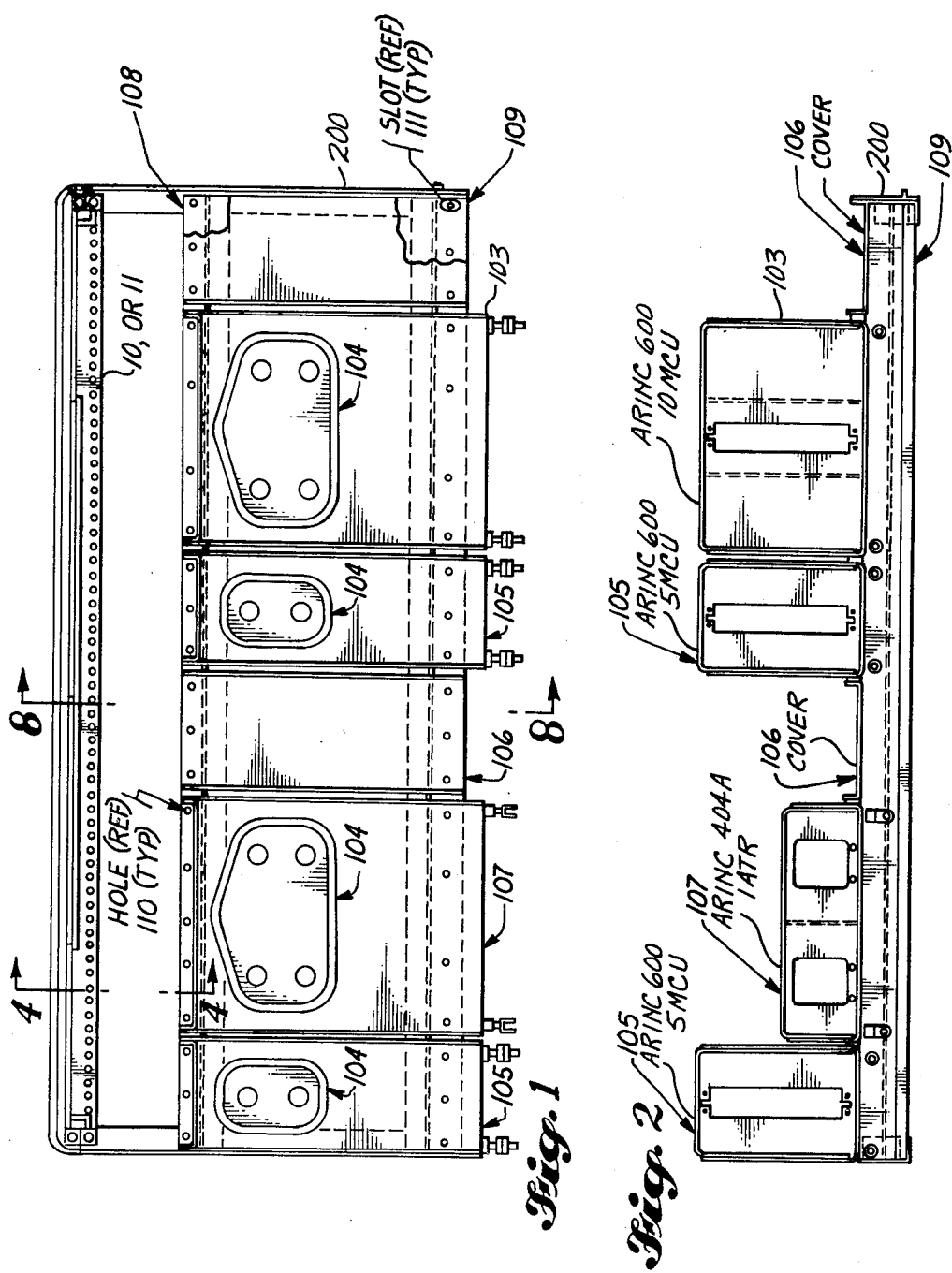

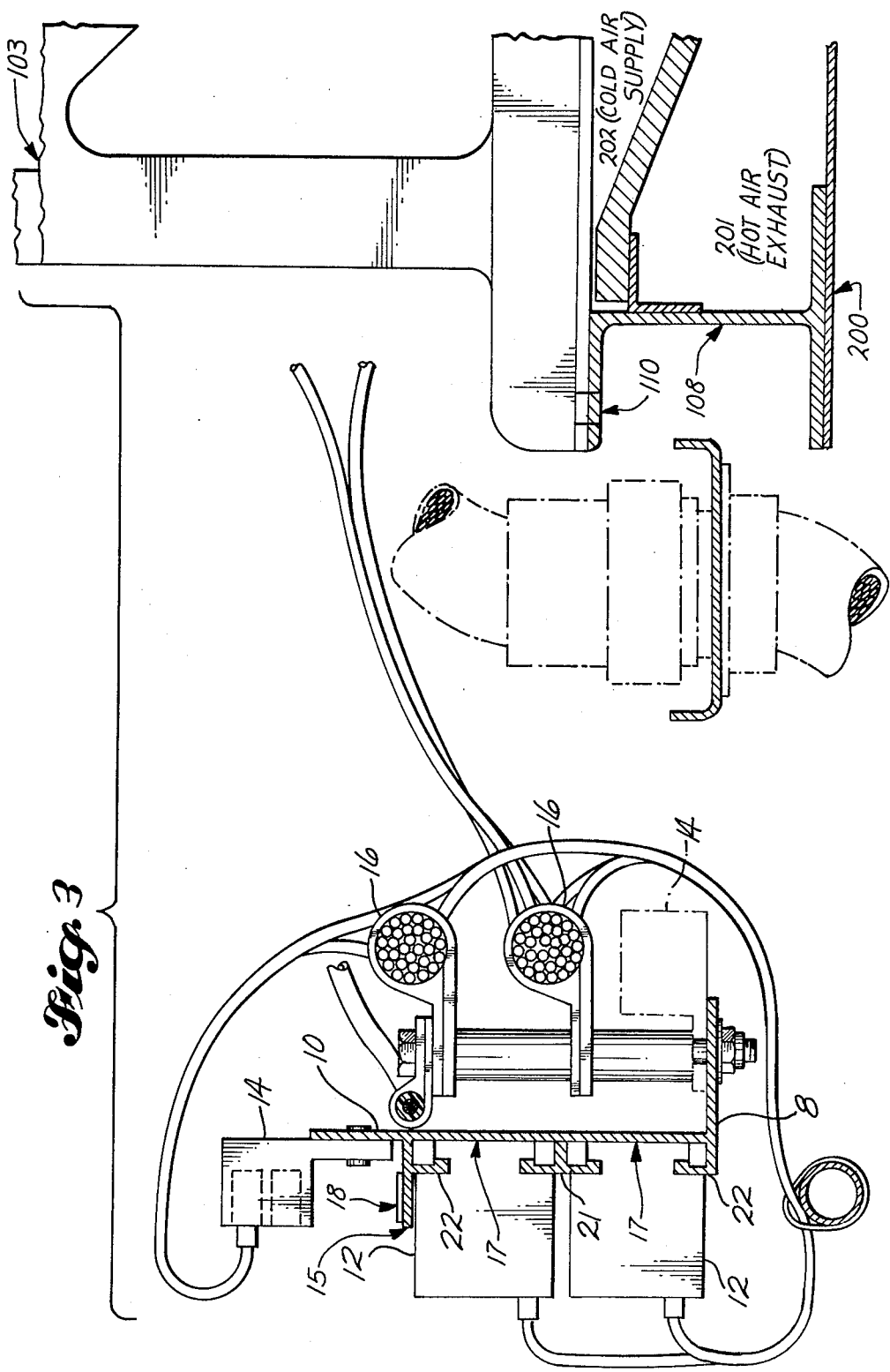

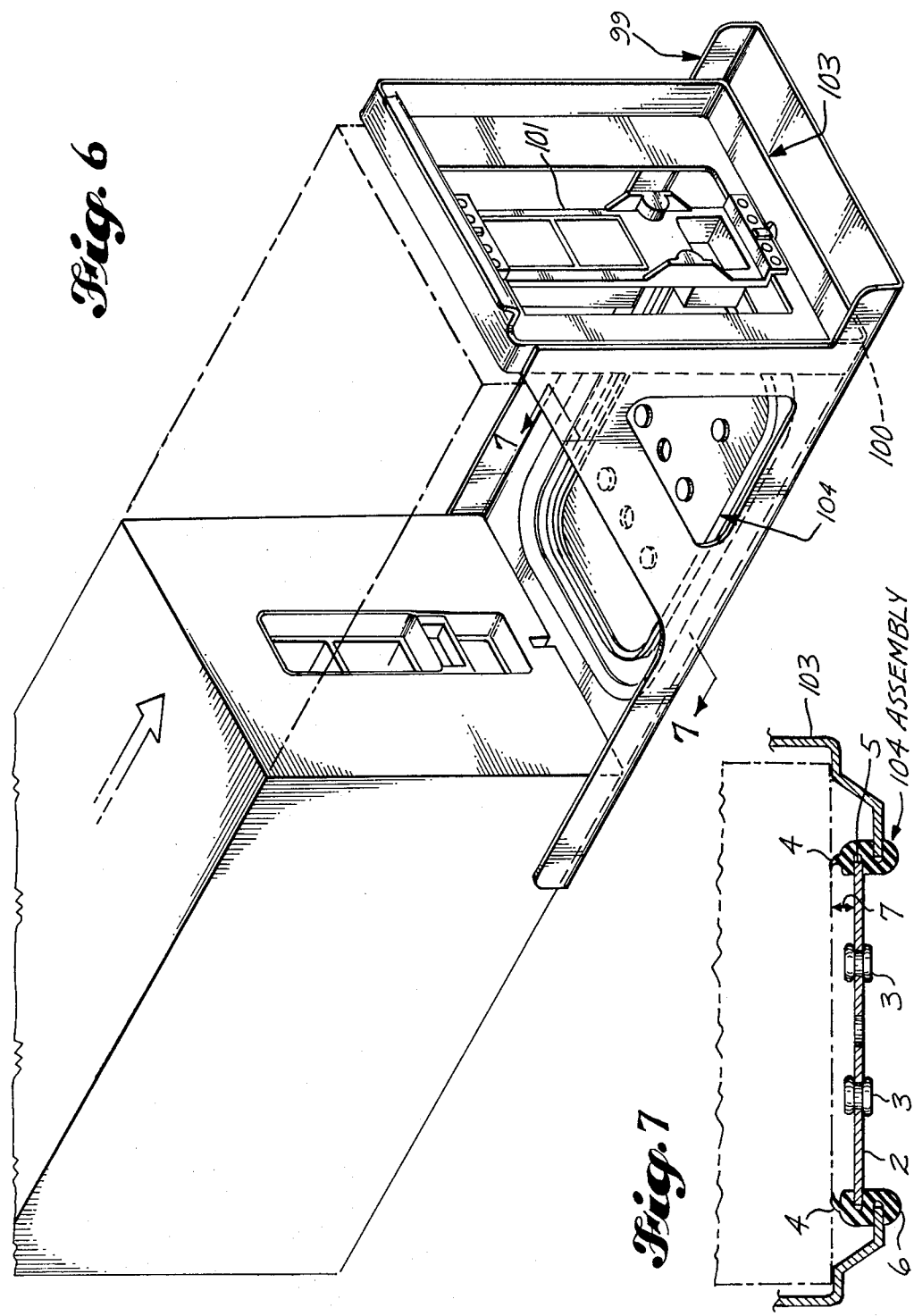

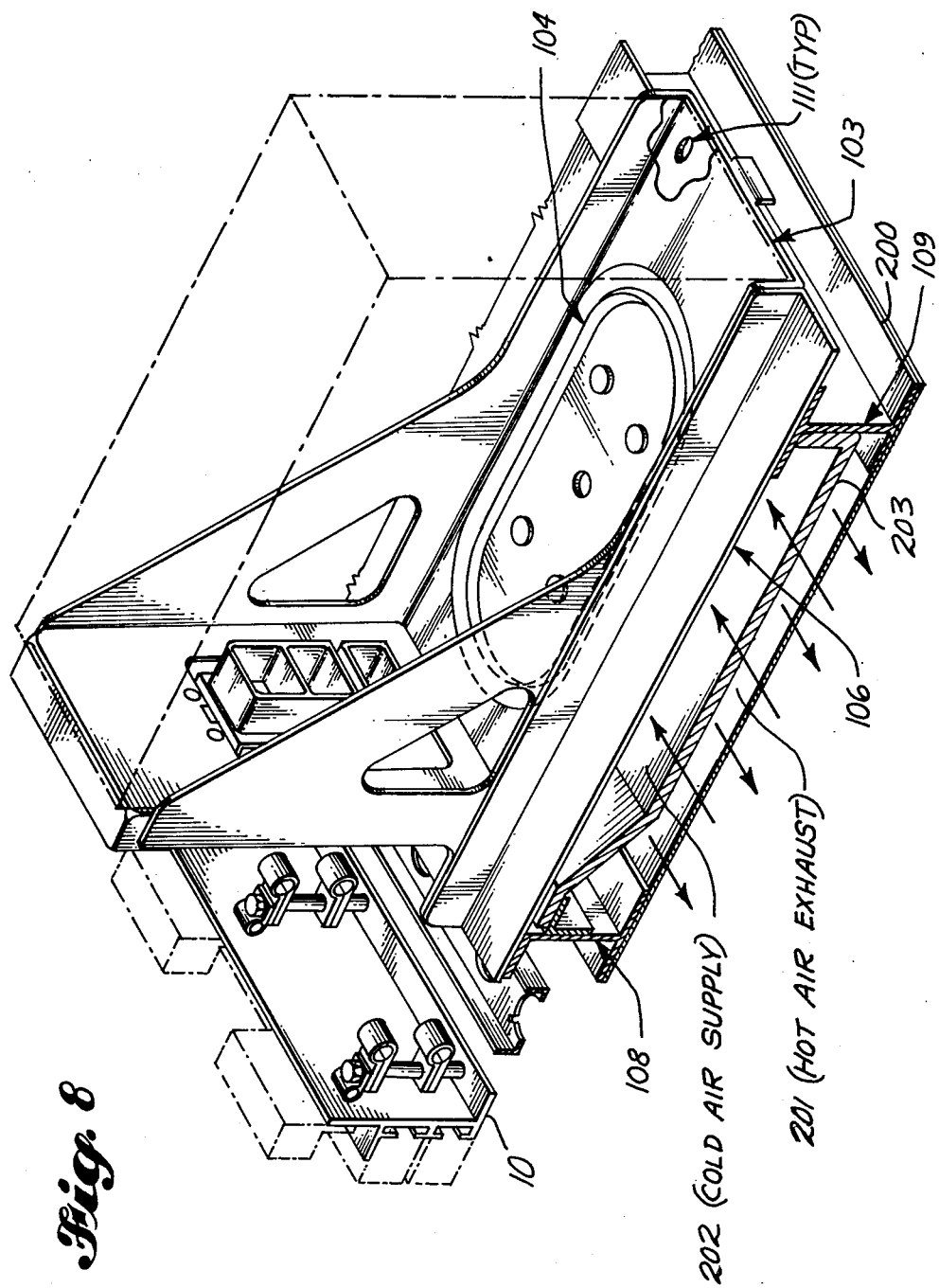

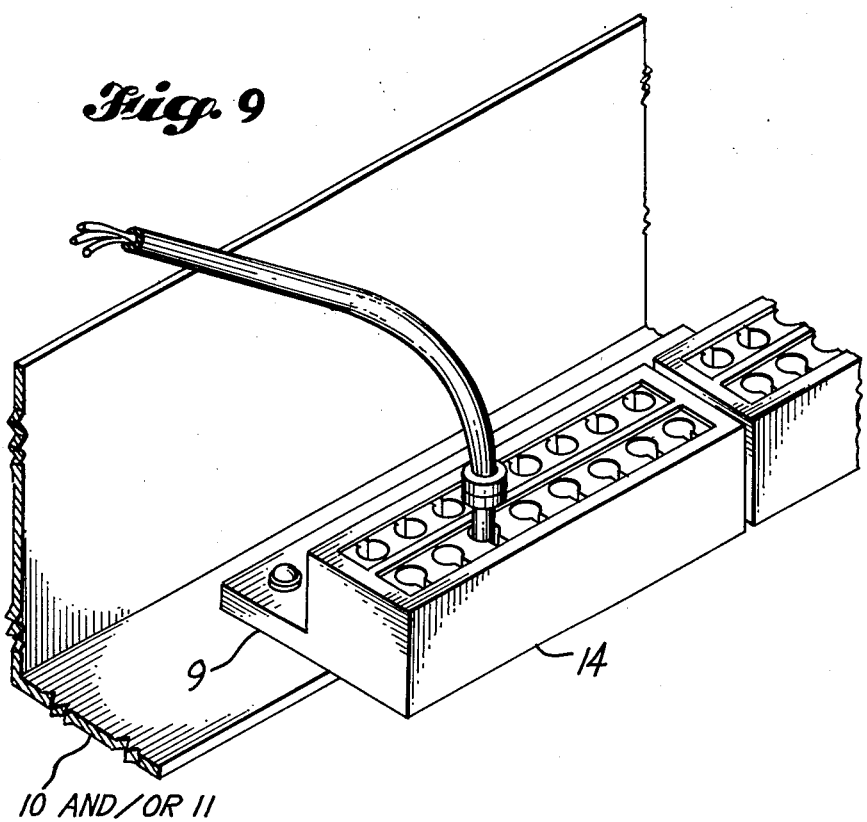

AVIONIC SHELF ASSEMBLY

The present invention relates to an avionic shelf assembly 200 which includes a basic mounting frame for avionic trays accommodating various size trays 103, 105-107 and further providing a structural member which also provides wire bundle and terminal block support 10 and 11. Hot and cold air plenums 201, 202 are featured as an integral part of the shelf. For airflow control a seal 6 is adhesively fastened to a metering plate 2 to form an inseparable assembly 104 to ease the installation process. Further cooling calibration is achieved through mounted push buttons 3 that are an integral part of the metering plate 2.

A preferred embodiment of the present invention includes an avionic rack shelf assembly 200 that will accept various combinations of electronic box sizes without undergoing a basic shelf structural change. A further feature includes an integral hot 201 and cold 202 air plenum chamber with the necessary isolation 203, the avionic rack shelf assembly further incorporating support features for electrical terminal and ground blocks and shelf wire bundles 10, 11.

It is, accordingly, an object of the present invention to provide rails 108, 109 of a shelf assembly 200 having holes 110 and slots 111 located corresponding to the mounting hole location of the avionics tray thereby permitting the shelf to receive various size trays.

It is a further object of the present invention to provide, in an integral avionic shelf assembly, a shelf utilizing both hot 201 and cold 202 plenums as an integral part of the shelf structure.

It is a further feature of the present invention to provide a track structure 10 and 11 forming the rear of the shelf, the geometric shape of the track structure being critical to the function of the overall shelf design and providing a ground path for ground blocks 14 when the shelf is tied to the rack through a ground strap, support for terminal modules 12 of the poke-home type, and a leg portion 8 to provide means for attaching wire bundle supports 16.

It is a further feature of the present avionic shelf assembly 200 system to provide means, including a shelf having both hot 201 and cold 202 air plenums isolated through utilization of lightweight insulating foam material 203.

Other objects and advantageous features of the preferred embodiment of the present invention will become readily apparent in view of the following detailed description taken in conjunction with the drawings in which:

FIG. 1 is plan view of a shelf assembly 200 in accordance with a preferred embodiment of the present invention reflecting the capability of the basic shelf structure to perform as a building block for any different number of configurations;

FIG. 2 is an elevational view of FIG. 1 and demonstrates the capability of the shelf 200 to handle the different sizes of ARINC boxes and spot them at any location along the width of the shelf;

FIG. 3 is a view taken along the lines 4—4 of FIG. 1 further illustrative of the versatility of the present shelf track design 10;

Figure 4:
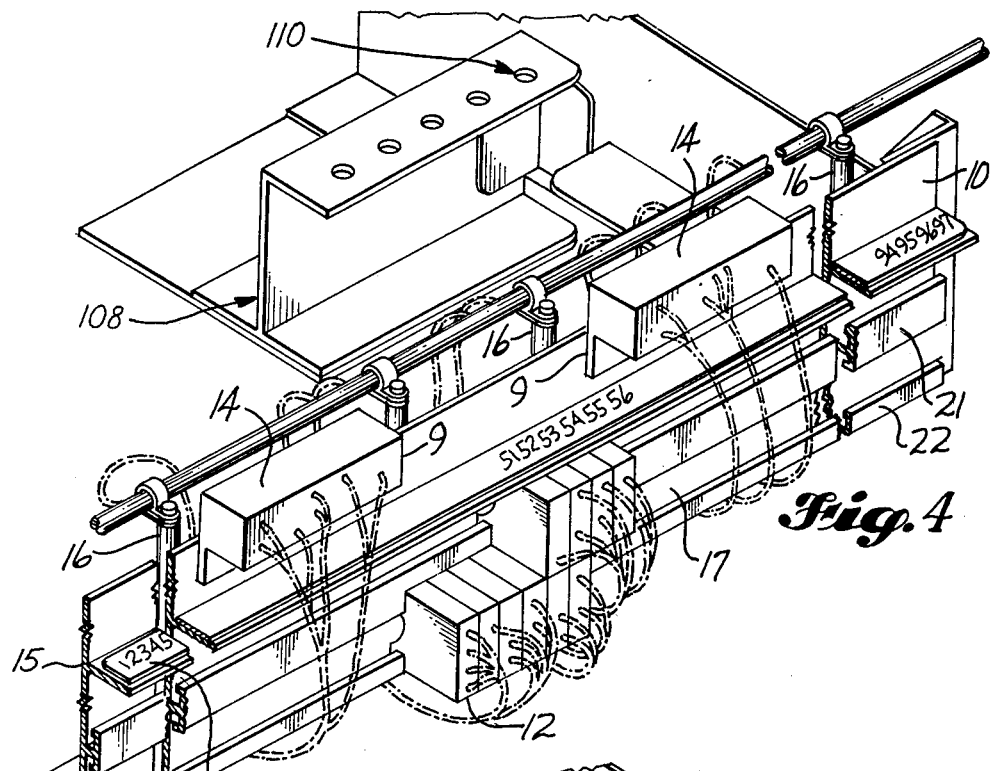
Figure 5:
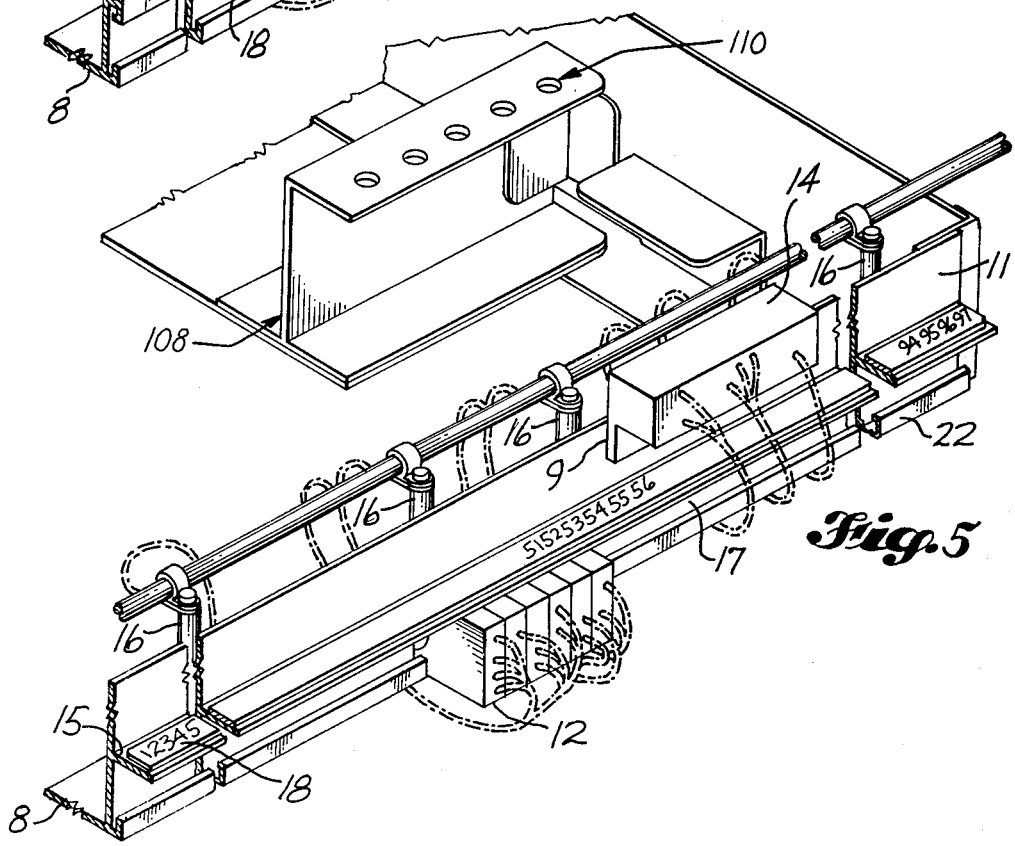

FIGS. 4 and 5 relate to FIG. 3 and are representative of an orthographic view of the track design 10 and 11 features in accordance with a preferred embodiment of the present invention including single track 11 as well as double track 10 concepts shown in FIG. 3;

FIG. 6 is an exploded view of the present avionic tray assembly 103 demonstrative of the avionic box interface;

FIG. 7 is a sectional cut through the tray assembly 103 of FIG. 6 showing how the seal 6 and orifice assembly 104 interacts with the avionic black box and mates with the tray assembly 103;

FIG. 8 is representative of a sectional cut along the lines 8—8 of FIG. 1 and demonstrative of the concept of integral plenum 201, 202 and 203 and avionic tray assembly 103 installation; and, FIG. 9 is representative of the ground block mounting shown in FIG. 3 and demonstrative of the concept of a poke-home ground block 14 and the continuous ground path feature of the track 10 and 11.

Turning now to FIG. 1, a complete view of the present avionic shelf assembly system 200 is shown which is illustrative of the several features detailed hereinafter in the remaining figures. The shelf assembly 200 shown in FIG. 1 enables a better appreciation of the overall electronic rack assembly hereinafter shown and discussed in detail. The electronic rack assembly is the final step in preparation of the building block approach to developing the avionics bay in an aircraft and comprises several shelf assemblies 200. The avionic shelf assembly 200 shown in FIG. 2 is compatible with the acceptance of ARINC 600 tray assemblies 103, 105-107 of various sizes and in combination, legends relating to ARINC assemblies such as ARINC 600 being included to illustrate the versatility of the present avionic shelf assembly system.

A special feature of the present avionic shelf assembly 200 includes the track 10 or 11 forming the rear of the shelf assembly shown in FIGS. 3, 4, and 5. Track 10 or 11 supports electrical terminal 12, ground blocks 14, and shelf wire bundle supports 16. Track 10 or 11 further accommodates the positioning of decals 18 that identify some of the functions of the shelf assembly. Track 10 or 11 further enables contribution to the structural integrity of the overall shelf assembly 200 in relation to areas of rigidity and deflection. Detailed understanding of track 10 and 11 features is included in the detailed description hereinafter given with respect to FIGS. 3, 4 and 5. Track 10 and 11 includes a ground path for ground block 14, as shown in FIG. 9, when the shelf is tied to the rack through a ground strap. Support means 17 comprising a track formed by flange members 21 and 22 of track 10 and 11 provide support for terminal modules 12. Terminal modules 12 shown in FIGS. 3, 4, and 5 comprise the poke-home type electrical connector. The shape of the extrusion forming track 10 and was configured utilizing track formed by flange portions 21 and 22 to accommodate the poke-home type electrical connector 12 which can be utilized in volumes up to several hundred depending on the length and depth of track member 10. A bottom leg portion 8 of track 10 and 11 provides, as seen in FIG. 3, for attachment of wire bundle supports 16. Leg portion 8 further provides an added structural strengthening feature to the fore-aft direction of the shelf. The rear, or flange support 21 and 22 track 10, and, 22 side, of track 11 includes space 15 provided along the entire track for decals that are used to identify terminal modules 12, ground blocks 14 and other miscellaneous items such as shelf number, as indicated in FIGS. 4 and 5. The hereinabove described geometric shape of the track member 10 and 11 is critical to provide the several functions utilized in overall shelf design in the present avionic shelf assembly system. The multi-functions provided by the geometry of track 10 and 11 further include strengthening where required as indicated hereinabove. Whether a single track 11 assembly, as shown in FIG. 5, or a double track 12, as shown in FIG. 4, is used is dependent on the number of terminal modules 12 that are required.

Turning now to FIG. 6, it will be seen that the tray assembly 103 utilizes a close tolerance backplate 100 that positions connector 101 at a precise location in the vertical and horizontal directions. Base portion 99 of the tray assembly supports the seal and backplate 100 assemblies and, in addition, controls the lateral and vertical travel of the avionic box. Close manufacturing tolerance of the tray assembly thereby permits a box engagement that is free from the following problems:

a. The elimination of sheared off backplate assemblies due to misalignment;
b. Damage to the avionic boxes themselves in the connector interface region; and
c. Operational problems of the avionic box by not permitting the box to be fully engaged.

FIG. 7 is illustrative of the several unique features of the present seal and orifice assembly 104. The geometry of the seal's cross section 6 was shaped in a manner to provide an adjustable lip 4 that would adapt to the variable tolerance of the avionic box tray assembly interface 7 while still providing an air tight seal. Adjustable lip 4 must have sufficient flexibility so as to eliminate any possibility of an air gap between the box and seal when tolerances are a maximum and yet be flexible enough to fold over (out of the way) when tolerances are a minimum. The base material 2 of the orifice assembly is made from a non-flamable substance that is non-metallic so as to affect weight savings in an aircraft environment. Metering plate 2 is bonded to the seal 6 at point 5 as a sub-assembly. An important feature of the present seal and orifice assembly is the method and means utilized to "meter" the air supply. The metering plugs 3 are lightweight, non-metallic, and not bonded in place (rely on a pressure fit), are calibrated (cross-sectional area determines the amount of air allowed to pass through), and reduce the assembly time by eliminating dash numbers (need only one dash number per MCU size). The total plugs 3 requirement for the maximum number of watts that can be dissipated for a given size of avionic box, is individually box sized at the shelf assembly. MCU is a term employed by ARINC 600 (Air Transport Avionics Equipment interfaces) to define avionic box size.

Turning now to FIG. 8, it will be seen that the shelf 200 utilizes the concept of both hot 201 and cold 202 air plenums as an integral part of the shelf 200. Such unique features can only be accomplished because of the utilization of lightweight insulating foam material 203. Such material 203 permits the separation of normally hot plenum space into two plenums that are, for practical purposes, completely isolated so as to prevent one from influencing the environment of the other. Such utilization of two plenums occupying the space normally occupied by one is advantageous in the utilization of less parts thereby permitting the shelf assembly 200 to occupy less space, shelf being lighter and shelf being less expensive to manufacture. Such features in weight savings have the hereinabove mentioned advantages for utilization throughout the airframe.

What is claimed is:

1. In combination in an avionic shelf assembly 200 for aircraft avionics:

one of a plurality of differently dimensioned avionics trays mounted on said shelf assembly;

a plurality of rails 108, 109, each of said rails having mounting holes 110 and slots corresponding to mounting hole locations of said one of a plurality of differently dimensioned avionics trays 103, 105-107 thereby permitting said avionic shelf assembly 200 to receive said one of a plurality of differently dimensioned avionics trays 103, 105-107;

a track 10 or 11 forming the rear of said shelf assembly 200, said track 10 or 11 including supporting means supporting a plurality of terminal modules 12 disposed along a rear first major surface area 21 and 22 of said track, said track further including a flange-like leg structure 8 extending from a front second major surface area of said track at right angles to said front second major surface area of said track thereby providing a surface region with means for attaching wire bundle supports 6 and further providing increase in structural strength to the fore-aft direction of the shelf;

said shelf assembly 200 including a hot 201 and a cold 202 air plenum integral with respect to said shelf 200 with insulating foam material 203 disposed between said hot and cold air plenum portions of said shelf;

and, said cold air plenum 202 including a metering plate 2 having a seal 6 and orifice assembly 104 connected therewith, said seal 6 having an adjustable lip 4 providing an air tight seal between said metering plate 2 and said one of a plurality of differently dimensioned electronics trays 103, 105-107.

2. The invention according to claim 1 wherein said seal and orifice assembly 104 includes a plurality of non-metallic, calibrated metering plugs 3 pressure fitted into apertures in said metering plate 2.

* * * * *